United States Patent
Rahhal-Orabi et al.

(10) Patent No.: US 7,709,866 B2
(45) Date of Patent: May 4, 2010

(54) METHOD FOR FORMING SEMICONDUCTOR CONTACTS

(75) Inventors: Nadia Rahhal-Orabi, Hillsboro, OR (US); Charles H. Wallace, Portland, OR (US); Alison Davis, Hillsboro, OR (US); Swaminathan Sivakumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 265 days.

(21) Appl. No.: 11/821,971

(22) Filed: Jun. 26, 2007

(65) Prior Publication Data

US 2009/0001431 A1    Jan. 1, 2009

(51) Int. Cl.
*H01L 29/51* (2006.01)
*H01L 21/469* (2006.01)

(52) U.S. Cl. .............. 257/288; 257/752; 257/750; 257/E23.186; 438/792

(58) Field of Classification Search ............ 257/308, 257/750, 752, 774, 288
See application file for complete search history.

(56) References Cited

U.S. PATENT DOCUMENTS

2004/0185609 A1*  9/2004  Okumura et al. ............ 438/199

OTHER PUBLICATIONS

U.S. Appl. No. 11/384,143, filed Mar. 17, 2006, entitled, "Method of Forming Trench Contacts For MOS Transistors," by Swaminathan Sivakumar, et al.
U.S. Appl. No. 11/644,639, filed Dec. 21, 2006, entitled, "Systems and Methods For Reducing Contact To Gate Shorts," by Nadia Rahhal-Orabi.
U.S. Appl. No. 11/678,059, filed Feb. 22, 2007, entitled, "Methods of Forming Transistor Contacts and Via Openings," by Nadia Rahhal-Orabi.

* cited by examiner

*Primary Examiner*—Jerome Jackson, Jr.
*Assistant Examiner*—Dale Page
(74) *Attorney, Agent, or Firm*—Trop, Pruner & Hu, P.C.

(57) ABSTRACT

In one embodiment of the invention, contact patterning may be divided into two or more passes which may allow designers to control the gate height critical dimension relatively independent from the contact top critical dimension.

19 Claims, 2 Drawing Sheets

300

305

400

METHOD FOR FORMING SEMICONDUCTOR CONTACTS

BACKGROUND

A semiconductor device, such as a transistor, may include contacts that connect a diffusion region or transistor node (e.g., source or drain) in the substrate to a metal layer. These contacts may be located adjacent to the transistor gate. Contacts may affect the manufacturing yield and device performance of the transistor. Unfortunately, an attempt to increase manufacturing yield may result in diminished device performance. For example, a contact with a larger bottom critical dimension (CD), located near the diffusion region in the substrate, may provide higher performance. However, a smaller CD in the contact near the top of the gate, at the gate height, might result in fewer contact to gate (CTG) shorts. Fewer such shorts may result in a better manufacturing yield. Thus, increasing the size of a contact may increase device performance but at the expense of manufacturing yield.

BRIEF DESCRIPTION OF THE DRAWINGS

The accompanying drawings, incorporated in and constituting a part of this specification, illustrate one or more implementations consistent with the principles of the invention and, together with the description of the invention, explain such implementations. The drawings are not necessarily to scale, the emphasis instead being placed upon illustrating the principles of the invention. In the drawings.

DETAILED DESCRIPTION

The following description refers to the accompanying drawings. Among the various drawings the same reference numbers may be used to identify the same or similar elements. While the following description provides a thorough understanding of the various aspects of the claimed invention by setting forth specific details such as particular structures, architectures, interfaces, and techniques, such details are provided for purposes of explanation and should not be viewed as limiting. Moreover, those of skill in the art will, in light of the present disclosure, appreciate that various aspects of the invention claimed may be practiced in other examples or implementations that depart from these specific details. At certain junctures in the following disclosure descriptions of well known devices, circuits, and methods have been omitted to avoid clouding the description of the present invention with unnecessary detail.

Figure 1:
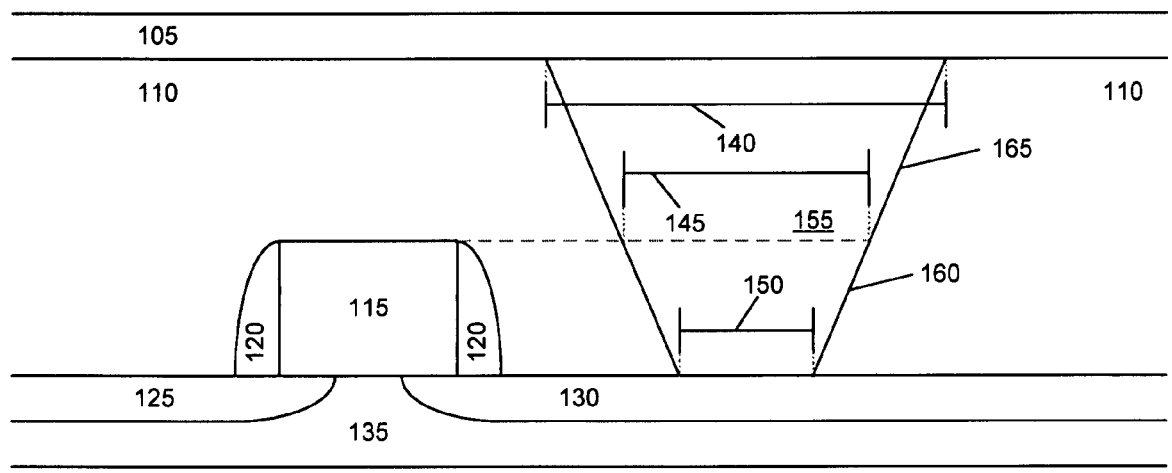
FIG. 1 is side cross section of a semiconductor device.

FIG. 1 is side cross section of a semiconductor device. Semiconductor device 100 includes a gate 115, spacers 120, diffusion areas 125, 130, substrate 135, dielectric layer 110, metallization layer 105, and contact 155.

CTG shorts are dominated by the CD at gate height 145. Thus, a smaller CD at gate height 145 may possibly increase manufacturing yield. However, performance may be proportional to the CD at the bottom of the contact 150. Specifically, a larger CD at the contact bottom 150 may increase device performance. In addition, a larger contact bottom CD 150 may promote proper overlap with trenches that may underlie the contact 155.

Using traditional techniques, contact 155 is formed using a contact patterning scheme that includes a single lithography step and a single etch step. In this "one pass" scheme, the contact etch carries along a consistent taper along the bottom sidewall 160 and top sidewall 165 of the contact 155.

Figure 2:
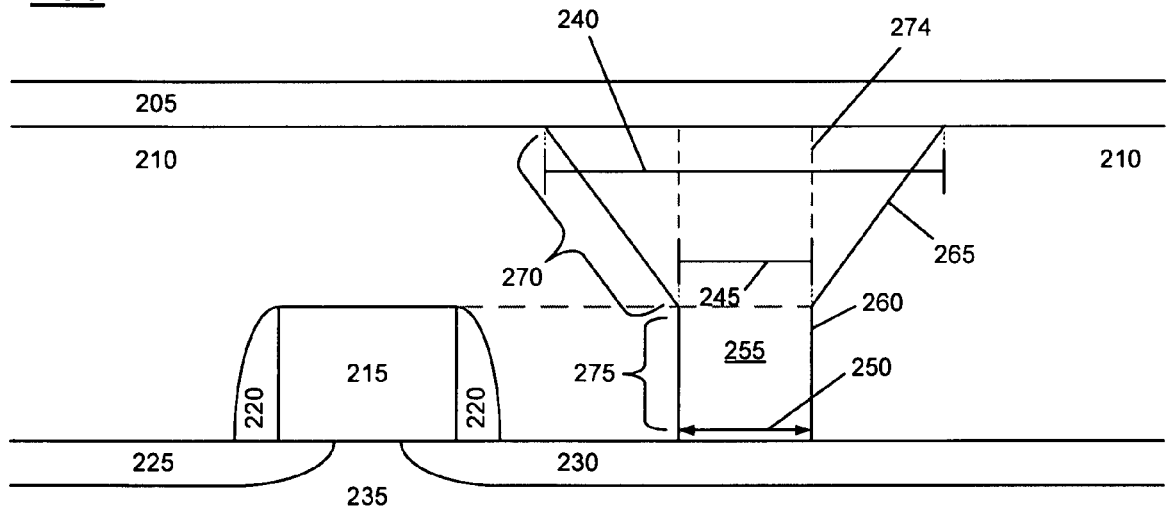
FIG. 2 is a side cross section of a semiconductor device in one embodiment of the invention.

FIG. 2 is a side cross section of a semiconductor device in one embodiment of the invention. Semiconductor device 200 includes a gate 215, spacers 220, diffusion areas 225, 230 (e.g., source, drain), substrate 235, dielectric layer 210, metallization layer 205, and contact 255. In one embodiment of the invention, contact 255 has a vertical, lower portion 275 and a broader, tapered, upper portion 270. The horizontal cross section of the contact may vary and includes, for example, circular and trench cross sections.

In contrast to the traditional device of FIG. 1, contact 255 in FIG. 2 may be formed using a "dual pass" technique instead of a "single pass" technique. Specifically, the contact patterning may be divided into two or more passes. In one embodiment of the invention there are two lithography steps and two etching steps. This may allow designers to control the CD at gate height 245 relatively independent from the CD at the top of the contact 240.

In one embodiment of the invention, the first lithography pass may print the contact 255 at a first CD 250. In embodiments of the invention wherein the sidewall 260 of the lower contact is vertical, the CDs at the contact bottom 250 and gate height 245 are the same. The first etch may extend from the contact top near the metallization layer 205 all the way to the contact bottom near the substrate 235. A second, subsequent lithography pass would broaden the contact and allow the upper side wall 265 to taper and produce a larger contact top CD 240. In one embodiment of the invention, the second etch may extend from the contact top down to the gate height and stop. Stopping the etch at gate height may be accomplished by timing the etch or with use of a strategically placed etch stop material. Thus, a wider upper contact portion 270 may promote device performance while a more narrowed or narrowing lower contact portion 275 may simultaneously promote manufacturing yield by avoidance of CTG shorts. This scheme maximizes the bottom CD for a given gate height CD without compromising the metal fill capabilities (as may be the case with vertical contacts).

Figure 3:
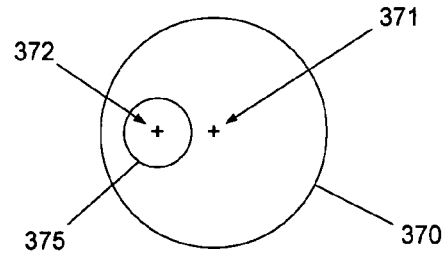
FIG. 3 is a top view of a semiconductor device in one embodiment of the invention.

FIG. 3 is a top view of a semiconductor device in one embodiment of the invention. Device 300 includes a metallization layer 305, upper contact portion 370 and a more narrowed lower contact portion 375. However, in this embodiment of the invention the central vertical axis 372 of the lower contact portion 375 is off-center and non-collinear with the central vertical axis 371 of the upper contact portion 370. Thus, splitting contact patterning into bottom contacts and top contacts formed with multiple photolithography passes may allow relative movement of the bottom CD 250 with respect to the CD at the contact top 240. This may de-convolute design restrictions on contact to trench overlap and contact to metal one layer overlap.

Figure 4:
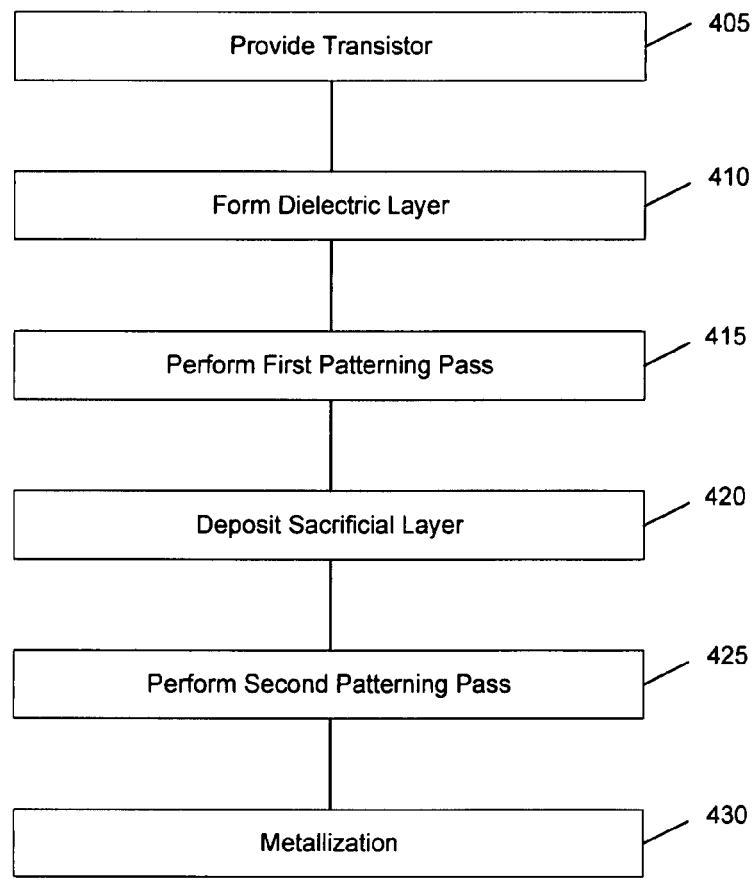
FIG. 4 is a method for forming a contact in a semiconductor device in one embodiment of the invention.

FIG. 4 is a method for forming a contact in a semiconductor device in one embodiment of the invention. In block 405, a MOS transistor is provided. The transistor may include a semiconductor substrate 235. The substrate may be formed using a bulk silicon or a silicon-on-insulator substructure. In other implementations, the substrate may be formed using alternate materials, which may or may not be combined with silicon, that include but are not limited to germanium, indium antimonide, lead telluride, indium arsenide, indium phosphide, gallium arsenide, or gallium antimonide. Although a few examples of materials from which the substrate may be formed are described here, any material that may serve as a foundation upon which a semiconductor device may be built falls within the spirit and scope of the present invention.

Each transistor may include a gate stack consisting of a gate electrode and a gate oxide layer. The gate electrode is a conductive layer that may be formed from one or more metal layers. Metal layers that may be used in the gate electrode include, but are not limited to, copper, aluminum, hafnium, zirconium, titanium, tantalum, titanium carbide, zirconium carbide, tantalum carbide, hafnium carbide, aluminum carbide, other metal carbides, ruthenium, palladium, platinum, cobalt, nickel, ruthenium oxide, other conductive metal oxides, titanium nitride, tungsten, tantalum nitride, cobalt, or an alloy of two or more of these metals. When the gate electrode is a metal, the corresponding gate oxide layer may consist of a thin, high-k dielectric layer. High-k dielectric materials that may be used for the gate oxide layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In alternate implementations, the gate electrode may consist of a polysilicon layer and its corresponding gate oxide layer may consist of a silicon dioxide layer.

The gate stack of each MOS transistor may be flanked by at least two diffusion regions 225, 230. The diffusion regions may form source and drain regions for each MOS transistor 200. The diffusion regions 225, 230 are formed by implanting dopants into regions of the semiconductor substrate 235 that are adjacent to the gate stacks 215. These dopants may include, but are not limited to, boron, aluminum, phosphorous, arsenic, and antimony.

In block 410, a dielectric layer 210 may be formed atop the MOS transistors. The dielectric layer 210 may be formed from materials such as silicon dioxide or carbon doped oxide. In some implementations, the dielectric layer 210 may be formed from materials such as silicon nitride, organic polymers such as perfluorocyclobutane and polytetrafluoroethylene, organosilicate glass, fluorosilicate glass (FSG), organosilicates such as silsesquioxane, and siloxane.

In block 415, a first photolithography process may be carried out to form openings that are in contact with the diffusion regions. For example, the first process forms what will be known as the lower contact portion 275. The opening formed by the first process is shown by the side walls 260 and 274 (phantom lines). The side wall 274 will later be removed and broadened during a second process described below. In one embodiment of the invention, the side walls 260, 274 are substantially vertical. A vertical etch is possible using techniques (e.g., oxygen) known to those of ordinary skill in the art. Vertical profiles can be achieved by minimizing the sidewall polymer deposition during the etch process. Typical dielectric etches are carried using high power plasma and CxFy (e.g., $C_4F_6$ and $C_4F_8$) based chemistries. One method to reduce sidewall deposition is to increase the oxygen ($O_2$) content in the plasma. Again, as mentioned above, the openings may have any number of horizontal cross-sectional shape (e.g., circular, trench).

The first photolithography process may include depositing a photoresist material on the dielectric layer 210 and patterning the photoresist using known photolithography techniques to define the diffusion openings. For example, a photoresist material may be deposited using a spin-on deposition (SOD) process, exposed to radiation (e.g., optical, electron beam, or extreme ultraviolet) through a mask that transfers a pattern for the trench openings, and exposed to a developer solution. The photoresist material remaining after development masks selected portions of the dielectric layer 210 such that any exposed portions will define the openings.

The first patterning process may include etching the exposed dielectric material to form diffusion openings. The etching process may be carried out using an etch chemistry that is appropriate for the dielectric material used. For instance, if the dielectric layer is silicon dioxide or carbon doped oxide, a CxFyHz etch chemistry may be used. For example, a high power plasma etch and CxFy (e.g., $C_4F_6$ and $C_4F_8$) based chemistry may be used. The openings that are formed may be cleaned using conventional processes, for instance, a plasma clean, a wet chemical clean, or a combination of both. The openings are in contact with the diffusion regions 225, 230.

In block 420, a sacrificial layer is deposited into the diffusion openings and onto the dielectric layer 210. The sacrificial layer may be planarized if needed, for instance, using a chemical mechanical polishing (CMP) process. The sacrificial layer may be formed from materials that include, but are not limited to, spin-on glass, other siloxane-based materials, and organic antireflective coatings. Deposition processes such as SOD, chemical vapor deposition (CVD), physical vapor deposition (PVD), or atomic layer deposition (ALD) may be used to deposit the sacrificial layer. The sacrificial layer provides a planar surface upon which a subsequent photolithography process may be carried out. In addition, the sacrificial layer may be tailored to provide reflectivity control to enable good patterning quality at the subsequent photolithography process.

In block 425, a second photolithography process may now be carried out to form the upper contact portion 270. In other words, the second process may remove wall 274 and broaden the upper contact 270 to include tapered walls 265. Of course, the newly formed wall 265 need not necessarily be tapered. The newly formed contact 255 may later be filled with metal to form electrical contacts to the diffusion area or any other area (e.g., gate stack) in need of a contact. For example, in accordance with implementations of the invention, openings for one or more local interconnects may also be formed at this process stage.

The second patterning process may be carried out in a similar manner as described above. In accordance with implementations of the invention, the etch chemistry and etch parameters are optimized to ensure that the sacrificial layer and the dielectric layer 210 are etched at substantially the same rate. The sacrificial layer, as well as any remaining photoresist material, may then be removed to expose all of the openings that have been formed. Methods of removing sacrificial layers and photoresist material are well known in the art, and may include wet chemical etching processes and plasma etching processes.

In block 430, a metallization process may be carried out to fill the opening with a suitable metal to form electrical contacts to the diffusion regions. Metallization processes such as CVD, plasma enhanced chemical vapor deposition (PECVD), PVD, sputter deposition, ALD, electroplating, electroless plating, or a combination of any of these processes, may be used to deposit one or more layers of metal in the trench openings.

Metals that may be used for the metallization include, but are not limited to, copper, ruthenium, palladium, platinum, cobalt, nickel, ruthenium oxide, tungsten, aluminum, titanium, tantalum, titanium nitride, tantalum nitride, hafnium, zirconium, a metal carbide, a conductive metal oxide, or combinations of the above.

The metal layer 205 may consist of multiple layers of metals. For instance, in one implementation, a first metal layer may consist of a seed layer, such as a copper seed layer or a noble metal catalyst layer, and a second metal layer may consist of a bulk metal layer such as copper. In further implementations, the various metal layers may provide various functionality, such as barrier layers, adhesion layers, and capping layers. Finally, a CMP process may be utilized, if needed, to planarize the deposited metal layer. Later, the metal layer may be patterned to provide proper power connections to various contacts built using the methodologies described herein.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
 a substrate to couple to a first transistor node and to a second transistor node;
 a metallization layer;
 a gate including a top and a bottom, the bottom to couple to the substrate and the top to couple to a gate contact and to extend no further than a first height above the substrate, the gate contact to couple the gate to the metallization layer;
 a first contact to couple the first transistor node to the metallization layer and to include a first portion and a second portion, the first portion extending from the first transistor node to the first height and the second portion extending from the first height to the metallization layer, and
 a second contact to couple the second transistor node to the metallization layer;
 wherein the first portion includes a first sidewall inclined at a first angle and the second portion including a second sidewall inclined a second angle, the first angle being more vertically oriented than the second angle.

2. The apparatus of claim 1, wherein the first sidewall is substantially vertical.

3. The apparatus of claim 2, wherein the second sidewall is tapered and is not vertical.

4. The apparatus of claim 3, wherein the first portion includes a first maximum diameter and the second portion includes a second maximum diameter, the first maximum diameter being no greater than 40 nm and the second maximum diameter being at least 80 nm.

5. The apparatus of claim 1, wherein the first portion includes a first central vertical axis and the second portion includes a second central vertical axis, the first central vertical axis being non-collinear with the second central vertical axis.

6. The apparatus of claim 1, wherein the gate top extends to the first height.

7. A method comprising:
 providing a transistor on a substrate, the transistor including a gate and at least one diffusion region formed on the substrate; wherein the gate includes a top that extends no further than a first height above the substrate;
 forming a dielectric layer atop the at least one diffusion region;
 performing a first photolithography process to form a first opening in the dielectric layer that couples to the at least one diffusion region, the first opening having an upper contact portion and a lower contact portion;
 depositing a sacrificial layer into the first opening;
 performing a second photolithography process to broaden the upper contact portion above the first height; and
 performing a metallization process to fill the upper contact portion and the lower contact portion to yield an apparatus comprising:
  the substrate to couple to a first transistor node and to a second transistor node;
  a metallization layer;
  the gate including a bottom, the bottom to couple to the substrate and the top to couple to a gate contact which is to couple the gate to the metallization layer;
  a first contact to couple the first transistor node to the metallization layer and to include the lower contact portion and the upper contact portion, the lower contact portion extending from the first transistor node to the first height and the upper contact portion extending from the first height to the metallization layer, and
  a second contact to couple the second transistor node to the metallization layer;
  wherein the lower contact portion includes a first sidewall inclined at a first angle and the upper contact portion includes a second sidewall inclined a second angle, the first angle being more vertically oriented than the second angle.

8. The method of claim 7, further comprising forming a substantially vertical sidewall in the lower contact portion.

9. The method of claim 7, further comprising forming a tapered sidewall above the first height in the upper contact portion.

10. The method of claim 9, wherein the lower contact portion includes a first maximum diameter and the upper contact portion includes a second maximum diameter, the first maximum diameter being no greater than 40 nm and the second maximum diameter being at least 80 nm.

11. The method of claim 7, further comprising forming the upper contact portion off center from the lower contact portion.

12. The method of claim 7, further comprising forming the gate top to extend to the first height.

13. The method of claim 7, further comprising performing the second photolithography process no lower than the first height.

14. The method of claim 7, further comprising:
 forming a first sidewall in the lower contact portion, the first sidewall having a first angle of inclination;
 forming a second sidewall above the first height in the upper contact portion, the second sidewall have a second angle of inclination;
 wherein the first angle of inclination is more vertical than the second angle of inclination.

15. An apparatus comprising:
 a substrate to couple to a first transistor node and to a second transistor node;
 a gate including a top and a bottom, the bottom to couple to the substrate and the top to couple to a gate contact;
 a first contact to couple to the first transistor node and to include a first portion and a second portion, the first portion extending from the first transistor node to the gate top height and the second portion extending from the gate top height towards the top of the apparatus;
 a second contact to couple to the second transistor node;
 wherein the first portion includes a first sidewall inclined at a first angle and the second portion including a second sidewall inclined a second angle, the first angle being more vertically oriented than the second angle.

16. The apparatus of claim 15, wherein the first sidewall is substantially vertical and the second sidewall is tapered and is not vertical.

17. The apparatus of claim 16, wherein the second sidewall continuously tapers beginning from the gate top height and continuing towards the first contact top.

18. The apparatus of claim 1, wherein the first portion includes a first central vertical axis and the second portion includes a second central vertical axis, the first central vertical axis being non-collinear with the second central vertical axis.

19. The apparatus of claim 1, wherein the (a) first and second portions are each formed using a first lithography step and a first etching step and the (b) second portion is broadened using a second lithography step and a second etching step neither of which are applied to the first portion.

* * * * *